United States Patent
van Oort et al.

(10) Patent No.: US 6,255,928 B1
(45) Date of Patent: Jul. 3, 2001

(54) MAGNET HAVING A SHIM FOR A LAMINATED POLE PIECE

(75) Inventors: Johannes Martinus van Oort; Evangelos Trifon Laskaris, both of Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/184,531

(22) Filed: Nov. 2, 1998

(51) Int. Cl.[7] .......................................................... H01F 1/00
(52) U.S. Cl. .......................... 335/216; 335/299; 335/301
(58) Field of Search .................................. 335/216, 299; 505/892, 899; 324/318, 321

(56) References Cited

U.S. PATENT DOCUMENTS

| | | | |
|---|---|---|---|
| 5,061,897 | * 10/1991 | Danby et al. | 324/318 |
| 5,124,651 | * 6/1992 | Danby et al. | 324/318 |
| 5,317,298 | * 5/1994 | Dorri et al. | 335/301 |
| 5,345,208 | * 9/1994 | Dorri et al. | 335/301 |
| 5,446,434 | 8/1995 | Dorri et al. | 335/301 |
| 5,627,471 | * 5/1997 | Kinanen | 324/319 |
| 5,677,854 | 10/1997 | Dorri | 364/578 |

OTHER PUBLICATIONS

Recently filed application 09/178320 van Oort, entitled, "Shim Assembly For a Pole Face of a Magnet".

* cited by examiner

*Primary Examiner*—Lincoln Donovan
*Assistant Examiner*—R. Barrera
(74) *Attorney, Agent, or Firm*—Douglas E. Erickson; Marvin Snyder

(57) ABSTRACT

A magnet having an imaging volume, a pole piece with a laminated portion including a first surface hole, a non-magnetizable first insert with an internally-threaded hole, and a first shim with a shape of an externally-threaded bolt. The first insert is positioned in the first surface hole and is attached to the pole piece. The first shim is threaded into the hole of the first insert. Additional shims for additional inserts for additional surface holes are used to shim the magnet to reduce magnetic field inhomogeneities in the imaging volume.

10 Claims, 2 Drawing Sheets

MAGNET HAVING A SHIM FOR A LAMINATED POLE PIECE

BACKGROUND OF THE INVENTION

The present invention relates generally to magnets, and more particularly to a magnet having a laminated pole piece and having a shim for reducing magnetic field inhomogeneity in the magnet.

Magnets include those having spaced-apart first and second pole pieces with generally opposing first and second pole faces, such as (but not limited to) "C"-shaped magnets. Typically, the pole piece has a laminated portion attached to a non-laminated iron base. The laminated portion includes alternating layers of magnetizable iron and non-magnetizable epoxy. Some magnet applications, such as magnetic resonance imaging (MRI) for medical diagnostics, employ superconducting magnets to generate a high strength magnetic field within an imaging volume located between the pole pieces. The imaging volume must have a low magnetic field inhomogeneity for high quality imaging. Known techniques for reducing the magnetic field inhomogeneity within the imaging volume include using shimming rings attached to each pole face to reduce axisymmetric magnetic field inhomogeneity and using shims adhesively bonded to a shim tray attached to the shimming rings to reduce 3D (three-dimensional) magnetic field inhomogeneity (including non-axisymmetric inhomogeneity and any remaining axisymmetric inhomogeneity). Typically, the laminated portion of the pole piece is configured as a plurality of concentric shimming rings, with a central circular ring surrounded by concentric annular rings, wherein the annular rings are formed from circumferentially-arrayed annular segments which are electrically insulated from each other. The number, mass, and position of the shims on the pole face are determined by shimming techniques known to those skilled in the art. Adhesively bonding a shim to the shim tray is time consuming as the shim must be manually held in place, against the magnetic field, until the adhesive sets. Reshimming the magnet requires debonding the attached shim and cleaning the removed shim and the attachment area on the pole face.

What is needed is a magnet design for a pole face magnet wherein the shims are more quickly and easily installed and removed.

BRIEF SUMMARY OF THE INVENTION

The magnet of the invention includes a magnetic resonance imaging volume, a pole piece, a non-magnetizable first insert, and a first shim. The pole piece has a laminated portion which includes alternating layers of magnetizable and non-magnetizable material and which includes a pole face facing generally toward the imaging volume. The pole piece also has a back face which is spaced apart from the pole face and which faces generally away from the imaging volume. The pole piece further has a first surface hole with a front opening which is located in the laminated portion at the pole face, wherein the first surface hole extends into the laminated portion of the pole piece. The first insert is positioned in the laminated portion of the first surface hole, is attached to the pole piece, and has an internally-threaded hole in communication with the front opening. The first shim has a shape of an externally-threaded bolt, wherein the first shim is threadably engageable in the hole of the first insert proximate the front opening. In one embodiment, the first shim is threadably engaged in the hole of the first insert, the pole piece includes additional surface holes, the magnet includes additional inserts positioned one each in a corresponding one of the additional surface holes, and the magnet includes additional shims threadably engaged one each with the hole of a corresponding one of only some of the additional inserts.

Several benefits and advantages are derived from the invention. Shims are quickly attached to the pole face by being threaded into holes in non-magnetizable inserts which are positioned in the laminated portion of the surface holes of the pole piece. The length of the shims can be chosen for a coarse shimming effect, and the threaded location of the shims (including how far each shim is threadably inserted into the hole and whether each shim has a portion left extending a particular distance outside the hole) can be chosen for a fine shimming effect, as can be appreciated by those skilled in the art. The non-magnetizable inserts prevent the creation of an electrical path between two magnetizable layers of the laminated portion through an installed shim, such a path creating unwanted eddy currents. Eddy currents increase the inhomogeneity of the magnetic field in the imaging volume which decreases the quality of the images. It is estimated that the time for shimming a magnet having opposing pole pieces may be reduced from about forty hours to about eight hours.

DETAILED DESCRIPTION OF THE INVENTION

Figure 1:
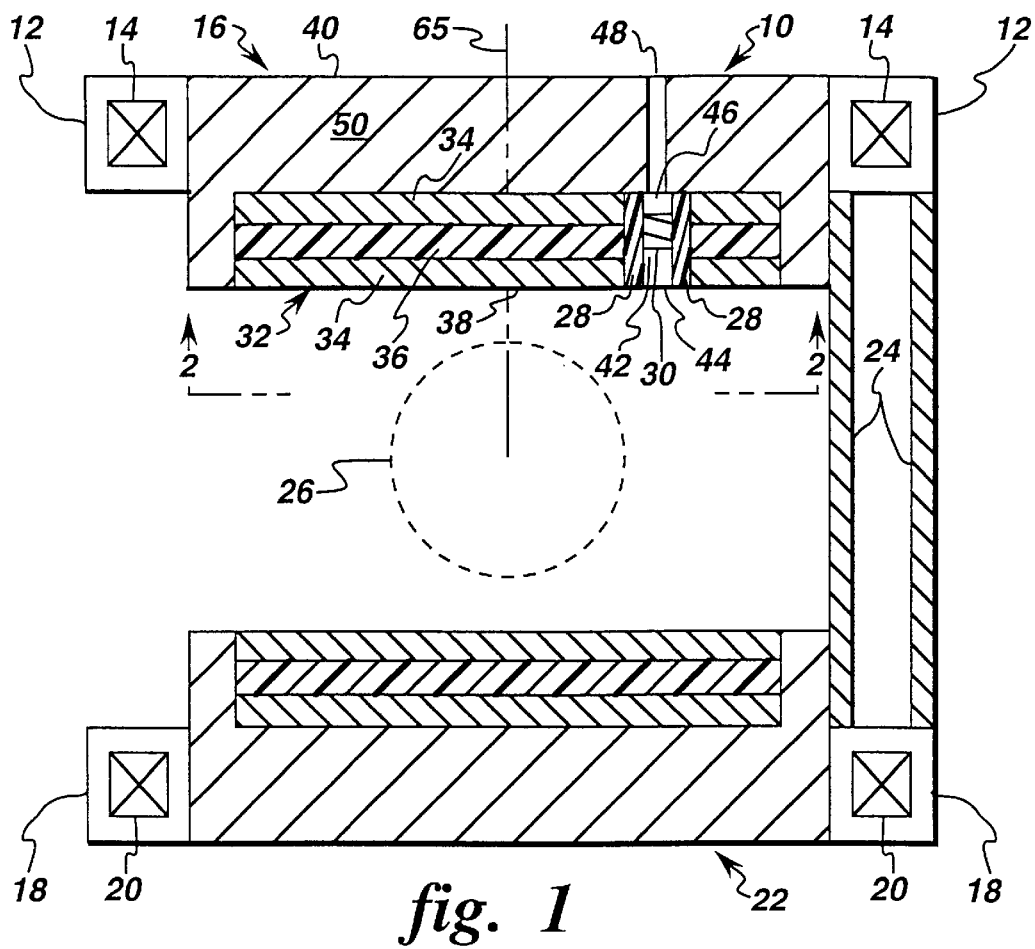
FIG. 1 is a schematic cross sectional view of a first embodiment of the magnet of the invention, wherein, for clarity, the laminated portion does not define shimming rings and only one surface hole (with an installed shim) of one of the pole pieces is shown.
Figure 2:
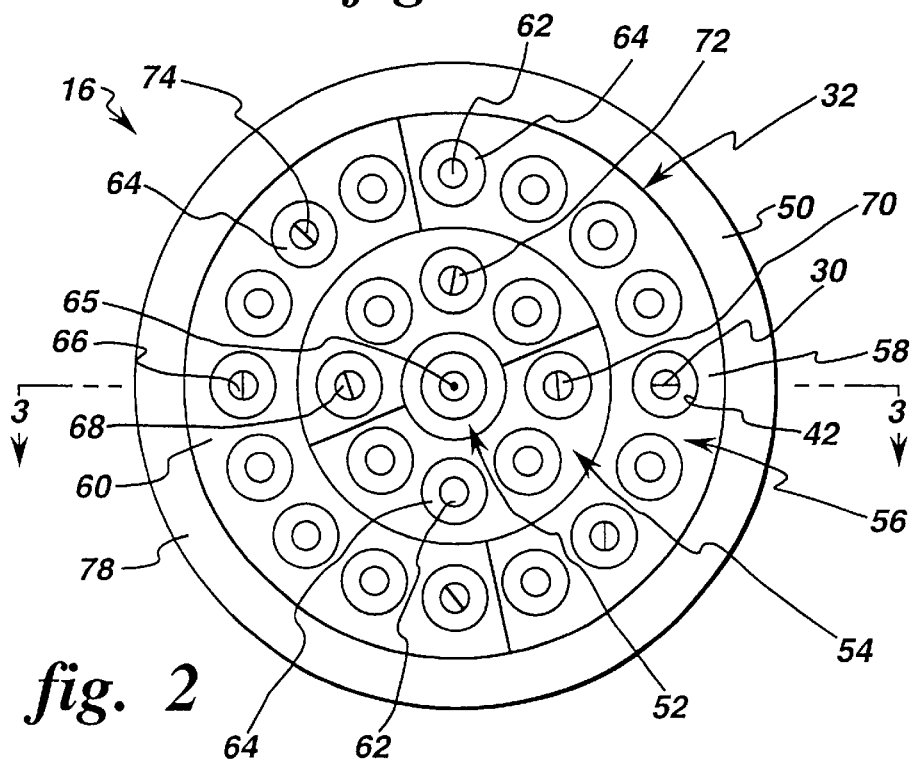
FIG. 2 is a schematic top planar view of the pole face of FIG. 1 taken along lines 2—2 of FIG. 1 showing many surface holes, an insert positioned in each surface hole, and a shim threadably engaged in only some of the inserts.
Figure 3:
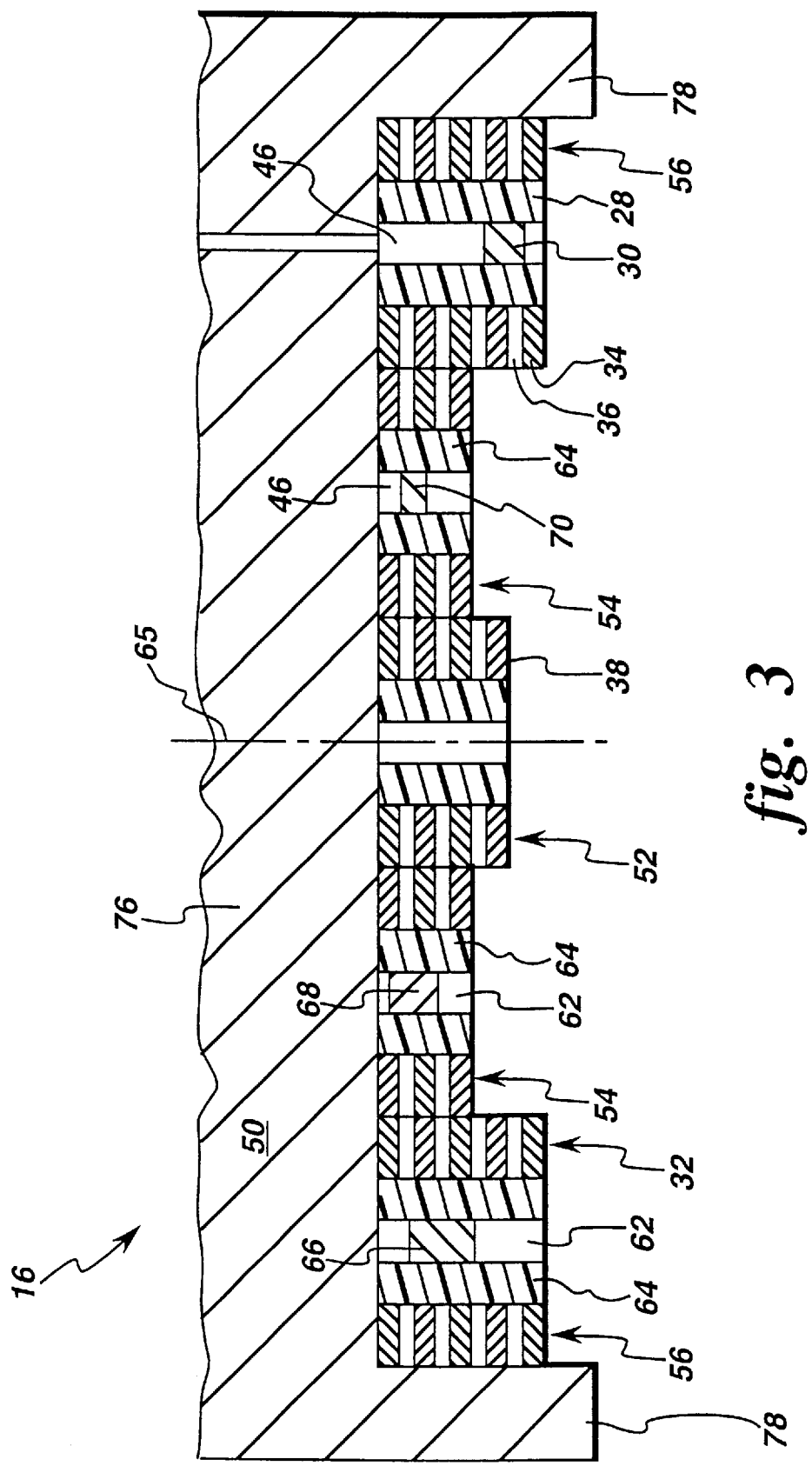
FIG. 3 is an enlarged cross-sectional view of FIG. 2 taken along lines 3—3 of FIG. 2 wherein the laminated portion has more layers and is shown defining shimming rings and wherein hatching of the non-magnetizable layers has been omitted for clarity.

Referring now to the drawings, wherein like numerals represent like elements throughout, FIGS. 1–3 show a first embodiment of the magnet 10 of the present invention. As seen in FIG. 1, magnet 10 includes a vacuum enclosure 12 containing a superconductive coil 14 and surrounding a pole piece 16 and includes a second vacuum enclosure 18 containing a second superconductive coil 20 and surrounding a second pole piece 22. Coil supports, additional superconductive coils, (including main, bucking, and shielding coils) and one or more thermal shields, all omitted from the figures for clarity, may be disposed within the vacuum enclosures 12 and 18 as is known to the artisan. The superconductive coils may be cooled by a liquid cryogen (e.g., liquid helium) or by a cryocooler coldhead, such cooling not shown and being known to those skilled in the art. A non-magnetizable support member 24 (such as a non-magnetic stainless steel support member) connects the pole piece 16 and the vacuum enclosure 12 with the second pole piece 22 and the second vacuum enclosure 18. Magnet 10 includes a magnetic resonance imaging volume 26 (shown as a dashed line in FIG. 1) having a magnetic field which is generated primarily by the superconductive coils 14 and 20 and which is enhanced primarily by the pole pieces 16 and 22. The imaging volume 26 is located between the pole pieces 16 and 22.

It is noted that magnet 10 could have additional spaced-apart support members (not shown). Also, the magnet of the invention could have the design of a table MRI (magnetic resonance imaging) magnet (not shown) which has only one pole face. Other known magnet designs (not shown) have additional pole pieces or have two pole pieces spaced apart by a plurality of support members, as can be appreciated by those skilled in the art. Further, it is understood that the magnet of the invention is not limited to a superconductive magnet, and the magnetic field of the imaging volume can be generated primarily by resistive coils and/or permanent magnets.

The magnet of the invention is a magnet 10 having a magnetic resonance imaging volume 26, a pole piece 16, a non-magnetizable first insert 28, and a first shim 30. The pole piece 16 has a laminated portion 32 which includes alternating layers of magnetizable material 34 (e.g., iron) and non-magnetizable material 36 (e.g., epoxy) and which includes a pole face 38 facing generally toward the imaging volume 26. The pole piece 16 also has a back face 40 which is spaced apart from the pole face 38 and which faces generally away from the imaging volume 26. The pole piece 16 further has a first surface hole 42 with a front opening 44 which is disposed in the laminated portion 32 at the pole face 38, wherein the first surface hole 42 extends into the laminated portion 32 of the pole piece 16. The first insert 28 is disposed in the first surface hole 42 in the laminated portion 32 of the pole piece 16 and is attached to the pole piece 16. The first insert 28 has an internally-threaded hole 46 in communication with the front opening 44. The first shim 30 has a shape of an externally-threaded bolt, wherein the first shim 30 is threadably engageable in the hole 46 of said first insert 28 proximate the front opening 44 of the first surface hole 42 of the pole piece 16. By "threadably engageable proximate the front opening" is meant that the first shim 30 can be threadably inserted in the hole 46 from the front opening side of the pole piece 16

Additional details of the first embodiment of the magnet 10 of the invention are given in this and the following paragraphs. The first shim 30 is disposable entirely within the hole 46 of the first insert 28. The length of the first shim 30 can be chosen for a coarse shimming effect, and the threaded location of the first shim 30 (including how far the first shim 30 is threadably inserted into the hole 46 and whether the first shim 30 has a portion left extending a particular distance outside the hole 46) can be chosen for a fine shimming effect, as can be appreciated by those skilled in the art.

The first surface hole 42 of the pole piece 16 has a back opening 48 which is disposed at the back face 40 of the pole piece 16. The first surface hole 42 typically, but not necessarily, has a generally circular cylindrical shape. The hole 46 of the first insert 28 is in communication with the back opening 48, and the first shim 30 is rotatably accessible through the back opening 48 when the first shim 30 is threadably engaged in the hole 46 of the first insert 28. This enables a suitably-slotted first shim 30 to be rotated by a screwdriver or wrench type tool (not shown) from either face 38 or 40 of the pole piece 16.

The pole piece 16 includes a non-laminated base 50, wherein the back face 40 of the pole piece 16 defines a surface of the base 50, and wherein the laminated portion 32 is attached to the non-laminated base 50. The first insert 28 extends from the pole face 38 of the laminated portion 32 of the pole piece 16 to the non-laminated base 50 of the pole piece 16. The non-magnetizable first insert 28 prevents the creation of an electrical path between two magnetizable layers 34 of the laminated portion 32 through an installed first shim 30, such a path creating unwanted eddy currents which would increase the inhomogeneity of the magnetic field in the imaging volume and thus decrease the quality of the images.

The laminated portion 32 of the pole piece 16 defines a plurality of shimming rings 52, 54, and 56 (seen in FIGS. 2 and 3) including a circular shimming ring 52 surrounded by a plurality of concentric annular shimming rings 54 and 56, with such shimming rings 52, 54, and 56 being attached to the base 50 of the pole piece 16. The shimming rings 52, 54, and 56 are used to correct for axisymmetric inhomogeneities in the magnetic field of the imaging volume 26 as is known to the artisan. One of the shimming rings 56 includes circumferentially-arrayed annular segments 58 and 60 (as seen in FIG. 2), wherein the first surface hole 42 is disposed in one of the segments 58. In one construction (not shown), there is one hole per annular segment. The segments 58 and 60 are electrically isolated from each other by suitable intervening insulation.

The laminated portion 32 of the pole piece 16 includes a plurality of additional surface holes 62 which are generally identical to the first surface hole 42. The magnet 10 also includes a plurality of additional inserts 64 which are generally identical to the first insert 28, which are disposed one each in a corresponding one of the additional surface holes 62, and which are attached to the pole piece 16. The pole face 38 has a longitudinal axis 65, and the first and the additional surface holes 42 and 62 are generally coaxially aligned with and arrayed generally axisymmetrically about the longitudinal axis 65.

The first shim 30 has a first length, and the magnet 10 also includes a second shim 66 which is generally identical to the first shim 30 but which has a length different from the first length. The first shim 30 consists essentially of a first material, and the magnet 10 also includes a third shim 68 which is generally identical to the first shim 30 but which consists essentially of a material different from the first material.

The first shim 30 is threadably-engaged in the hole 46 of the first insert 28, and the magnet 10 also includes a plurality of additional shims 70, 72, and 74 having a shape of an externally-threaded bolt. The additional shims 70, 72, and 74 are threadably engaged one each in the hole of a corresponding one of only some of the additional inserts 64. The first and the additional shims 30, 70, 72, and 74 are arrayed non-axisymmetrically about the longitudinal axis 65 of the pole face 38. The first shim 30 is disposed to a first depth in the hole 46 of the first insert 28, and at least one of the additional shims 70 is disposed in the hole 46 of the corresponding additional insert 64 to a depth which is different from the first depth.

In one design, the base 50 of the pole piece 16 has a central region 76 and an adjacent annular peripheral region 78. The central circular region 76 is longitudinally recessed relative to the adjacent annular peripheral region 78, and wherein the laminated portion 32 of the pole piece 16 is attached to the central circular region 76. It is noted that the base 50 may, without limitation, be solid iron, and that the laminated portion 32 may, without limitation, have alternating amorphous steel and epoxy laminations 34 and 36. In one construction, the first insert 28 consists essentially of FRP (a fiber reinforced plastic such as a glass fiber epoxy) with the hole 46 created by a threaded plug which is removed after the epoxy has cured, as can be appreciated by the artisan. In another construction, the first shim 30 is a cast shim consisting essentially of low carbon steel or consisting essentially of a permanent magnet. The first shim 30 has a shape of a set screw. The actual shimming is done by determining the required weight of the shims 30, 66, 68, 70, 72, and 74 and by choosing the appropriate shim length and insertion depth, as is within the skill of the artisan. One method includes computing the required magnetization at each insert location and performing a linear-programming optimization on the shim weights based on a calibration field map.

The shims 30, 66, 68, 70, 72, and 74 are used to reduce 3D (three-dimensional) magnetic field inhomogeneity (including non-axisymmetric inhomogeneity and any remaining axisymmetric inhomogeneity not corrected for by the shimming rings 52, 54, and 56). It is estimated that the time for shimming a magnet 10, having opposing pole pieces 16 and 22, with shims 30, 66, 68, 70, 72, and 74 may be reduced from about forty hours to about eight hours.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. A magnet comprising:
   a) a magnetic resonance imaging volume;
   b) a pole piece having a laminated portion which includes alternating layers of magnetizable and non-magnetizable material and which includes a pole face facing generally toward said imaging volume, said pole piece also having a back face which is spaced apart from said pole face and which faces generally away from said imaging volume, and said pole piece further having a first surface hole with a front opening which is disposed in said laminated portion at said pole face, wherein said first surface hole extends into said laminated portion of said pole piece;
   c) a non-magnetizable first insert which is disposed in said first surface hole in said laminated portion of said pole piece, which is attached to said pole piece, and which has an internally-threaded hole in communication with said front opening; and
   d) a first shim having a shape of an externally-threaded bolt, wherein said first shim is threadably engageable in said hole of said first insert proximate said front opening.

2. The magnet of claim 1, wherein said first shim is disposable entirely within said hole of said first insert.

3. The magnet of claim 1, wherein said first surface hole has a back opening which is disposed at said back face, wherein said hole of said first insert is in communication with said back opening, and wherein said first shim is rotatably accessible through said back opening when said first shim is threadably engaged in said hole of said first insert.

4. The magnet of claim 1, wherein said pole piece includes a non-laminated base, wherein said back face of said pole piece defines a surface of said base, wherein said laminated portion defines a plurality of concentric shimming rings, and wherein said shimming rings are attached to said base.

5. The magnet of claim 4, wherein one of said shimming rings includes circumferentially-arrayed annular segments, and wherein said first surface hole is disposed in one of said segments.

6. The magnet of claim 1, wherein said pole face has a longitudinal axis, wherein said laminated portion includes a plurality of additional surface holes which are generally identical to said first surface hole, wherein the magnet also includes a plurality of additional inserts which are generally identical to said first insert, which are disposed one each in a corresponding one of said additional surface holes, and which are attached to said pole piece, and wherein said first and said additional surface holes are generally coaxially aligned with and arrayed generally axisymmetrically about said longitudinal axis.

7. The magnet of claim 6, wherein said first shim has a first length, and also including a second shim which is generally identical to said first shim but which has a length different from said first length.

8. The magnet of claim 6, wherein said first shim consists essentially of a first material, and also including a third shim which is generally identical to said first shim but which consists essentially of a material different from said first material.

9. The magnet of claim 6, wherein said first shim is threadably-engaged in said hole of said first insert, and also including a plurality of additional shims having a shape of an externally-threaded bolt and threadably engaged one each with in hole of a corresponding one of only some of said additional inserts, and wherein said first and said additional shims are arrayed non-axisymmetrically about said longitudinal axis.

10. The magnet of claim 9, wherein said first shim is disposed to a first depth in said hole of said first insert, and wherein at least one of said additional shims is disposed in said hole of said corresponding additional insert to a depth which is different from said first depth.

* * * * *